United States Patent [19]

Kolodzey

[11] 4,339,822
[45] Jul. 13, 1982

[54] DIODE LASER DIGITAL MODULATOR

[75] Inventor: James S. Kolodzey, Ossining, N.Y.

[73] Assignee: Optical Information Systems, Inc., Elmsford, N.Y.

[21] Appl. No.: 64,785

[22] Filed: Aug. 8, 1979

[51] Int. Cl.³ .............................................. H01S 3/10
[52] U.S. Cl. ....................................... 372/26; 372/38; 372/29; 372/36
[58] Field of Search ................. 331/94.5 M, 94.5 H, 331/94.55; 307/264, DIG. 1, 455, 475, 311, 270

[56] References Cited

U.S. PATENT DOCUMENTS 3,760,200 9/1973 Taniguchi et al. ................... 307/455
3,968,399 7/1976 Jarrett ................................. 307/311
4,009,385 2/1977 Sell ................................. 331/94.5 M Primary Examiner—William L. Sikes
Assistant Examiner—Léon Scott, Jr.
Attorney, Agent, or Firm—Arthur L. Plevy; Paul E. Purwin; David W. Collins

[57] ABSTRACT

A digital modulator provides high speed modulation of a semiconductor diode laser or light emitting diode. The circuit is compatible with standard TTL and ECL integrated logic circuits and operates with a positive ground for convenient heat sinking.

6 Claims, 3 Drawing Figures

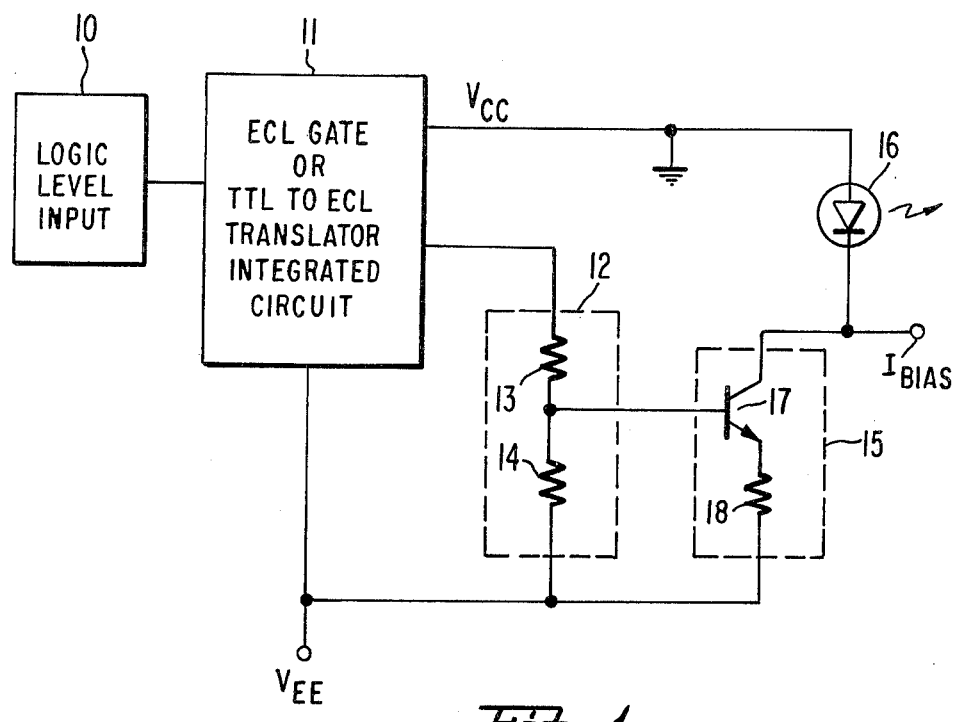
_Fig_1_
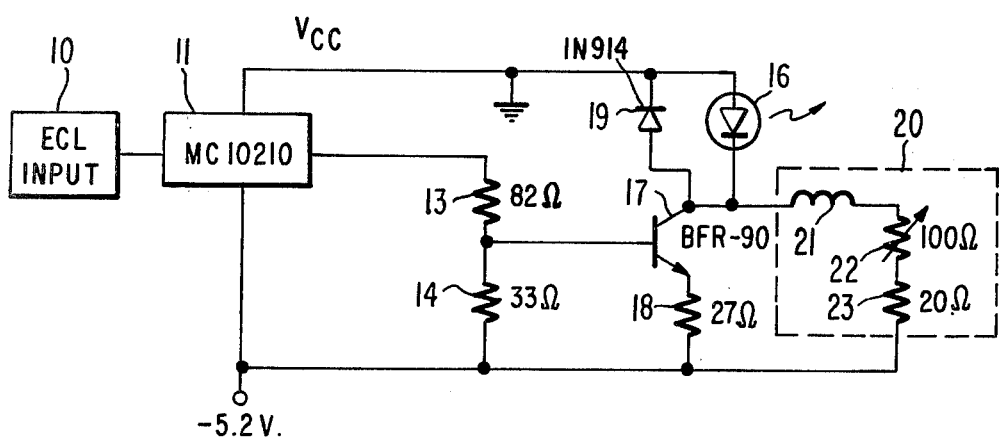
_Fig_2_

DIODE LASER DIGITAL MODULATOR

BACKGROUND OF THE INVENTION

1. Field of the Invention

This invention relates to modulation circuits, and in particular, to a circuit providing high speed modulation of a semiconductor diode laser or light emitting diode.

2. Description of the Prior Art

It is commonly known that the amplitude (intensity) of a laser beam emitted from a semiconductor diode laser can be modulated by modulating the injection current supplied to the diode laser. Thus, when a diode laser is used as a source of light in optical communications, the laser beam, which is the carrier, can be directly modulated by the injection current.

The modulation is typically supplied by external circuitry. Depending on a number of factors, the circuitry may derive from integrated logic circuits such as TTL (Transistor-Transistor Logic) and ECL (Emitter Coupled Logic). However, digital modulation with standard IC logic families is often difficult due to:

(1) lack of sufficient modulation current,
(2) inappropriate logic voltage levels, and
(3) incompatibility of the IC with a grounded p-side (anode) connection of the laser.

As is well-known, the laser's heat-producing p-side is usually directly bonded to a heat sink package. Since good circuit practice requires grounding large metallic components it is therefore desirable to ground the heat sink.

An article in Electronic Design, July 19, 1974, pages 96–99, discloses use of an ECL gate to modulate light emitting diodes (LED) at high data rates. Extension of the concept to drive double heterostructure AlGaAs diode injection lasers is also disclosed. However, the anode is connected to $V_{bias}$, which is incompatible with the grounded anode for good heat sinking as previously mentioned.

U.S. Pat. No. 4,009,385, which describes a pre-bias control circuit, includes a typical emitter coupled transistor driving circuit for the laser. However, the transistor pair disclosed requires an external reference voltage, which may not be available or compatible with standard logic IC's. Further, the modulation current can change with temperature or with variations of input signal (due to loss or component variation).

A need remains for a modulator for a diode laser compatible with integrated circuit logic families.

SUMMARY OF THE INVENTION

In accordance with the invention, a digital modulator is provided for diode lasers and light emitting diodes having a positive ground. The modulator of the invention affords high speed modulation of a semiconductor diode laser or light emitting diode and is compatible with TTL and ECL integrated logic circuits. The modulator comprises:

(1) means for receiving a first control signal from a logic input, (2) means for generating a second control signal from the first control signal, the second control signal having a voltage compatible with ECL logic circuitry, (3) means for increasing the voltage to a level sufficient to drive the diode laser or LED, and (4) means for converting the increased voltage to a modulating current in order to modulate the diode laser or LED.

The modulator of the invention provides an industry standard input interface (TTL or ECL integrated circuit logic family), rather than a transistor network where the input changes with different laser driving conditions. Also, a combination of an integrated circuit input and a grounded laser anode (p-side) connection for good heat sinking is provided.

BRIEF DESCRIPTION OF THE DRAWING

FIG. 1 depicts a portion of a laser digital modulator circuit in accordance with the invention;

FIG. 2 depicts a modulator circuit employing that portion of the circuit depicted in FIG. 1.

DETAILED DESCRIPTION OF THE INVENTION

Figure 3:
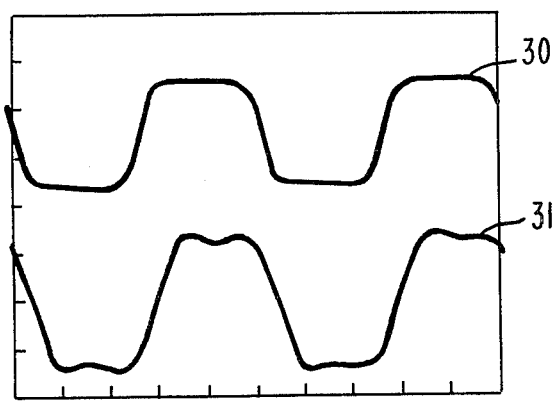
FIG. 3, on coordinants of volts and seconds, depicts performance of the circuit of FIG. 2 at 200 Megabits/sec data rate.

The electrical operation of the modulator circuit of the invention is described with reference to FIG. 1. A logic level input 10 provides a first control signal. Means for receiving the first control signal and generating a second control signal therefrom are shown generally at 11.

Logic input levels are either TTL (Transistor-Transistor Logic, where a logic "one" equals +5 volts and a logic "zero" equals 0 volts) or ECL (Emitter Coupled Logic, where a logic "one" equals −0.8 volts and a logic "zero" equals −1.8 volts), depending on the choice of input integrated circuit (IC).

With TTL inputs, a TTL to ECL translator IC is used. An example of such a translator is designated MC10124 (available from, e.g., Motorola Corporation, Phoenix, Ariz.).

With ECL inputs, a full ECL gate is used. An example of an ECL gate is designated MC10210 (available from, e.g., Motorola Corporation, Phoenix, Ariz.). While not required in the operation of the invention, the ECL gate advantageously serves to isolate the diode laser from external circuitry. Advantages to using an input IC in this manner are that a characterized and industry standard input is provided, on chip circuit temperature stability is maintained and output levels are independent of small input variations.

In any event, the IC output is always ECL compatible. A voltage source $V_{EE}$ provides operating voltage, and is typically about −5.2 V for ECL IC's.

ECL output levels are desirably used because of the grounded common ($V_{CC}$), which is compatible with the laser grounded anode, and negative logic levels, which are compatible with forward biasing the laser. However, the −0.8, −1.8 volt logic swing is insufficient to drive the diode laser, which typically requires −2.5 V. Proper voltages are provided by means 12 for increasing the voltage to a sufficient level. Means 12 level shifts the −0.8, −1.8 volt swing to a −3.9, −4.2 volt swing and is conveniently provided by a resistor divider comprising resistors 13 and 14 as shown.

Means 15 for converting the increased voltage to a modulating current in order to modulate diode laser 16 is driven by the level shifting means and conveniently comprises a transistor 17 and resistor 18. The voltage level increase provided by means 12 is necessary to accommodate both the 2.5 V (approximate) laser voltage drop and a 2 V minimum drop across the transistor collector and emitter needed to bias the transistor in the high speed linear region. The shifted voltage swing both drives the base of transistor 17 and is converted to a current swing at the collector, and also biases it in the active region for high speed operation. The transistor and resistor 18 are configured as a voltage to current converter. Resistor 18 provides emitter feedback to increase high frequency response and desensitize the output to temperature changes. The transfer ratio of the transistor collector current swing $\Delta I_L$ (modulating the laser) to input base voltage swing $\Delta V_b$ is $$\Delta I_L / \Delta V_b = 1/R_e$$

where $R_e$ is the value of resistor 18.

It will be observed that this ratio depends only on $R_3$ and is independent of any laser parameters. This laser independence is good for circuit manufacturability, because identical modulation currents are provided to different lasers and laser bias conditions. The modulation current swing can be varied simply by changing the value of $R_e$. For typical values, $\Delta V_b = 0.3$ V, $R_e = 30 \Omega$, and thus $\Delta I_L = 10$ mA.

The diode laser employed in the circuit of the invention is preferably of the double heterostructure type fabricated from layers of gallium arsenide and gallium aluminum arsenide such as described in U.S. Pat. Nos. 3,691,476, 3,733,561 and 3,758,875. Light emitting diodes are also suitably modulated by the circuit of the invention.

As is well-known, diode lasers are usually prebiased at a value near (above or below) threshold current (typically 100 mA) in order to be more responsive to modulation by avoiding the time delay associated with charging the laser capacitance to threshold. Laser biasing, which is optional, depending on the desired output power given the modulation current, is achieved by adding the desired current $I_{bias}$ through an external current source at the collector of transistor 17 as shown in FIG. 1. If the $I_{bias}$ is supplied by a high impedance source (several hundred ohms or more), it will not affect modulator circuit operation.

Laser bias current can be obtained with an optical feedback bias control circuit, such as depicted in Bell System Technical Journal, Vol. 57, p. 1823, 8/6/78, or with a simple R-L network as shown in FIG. 2.

FIG. 2 depicts a specific circuit for modulating a diode laser, employing ECL input and utilizing a full ECL gate (MC10210). A diode 19 (optional) is connected in parallel and biased in reverse direction with respect to the diode laser in order to protect the diode laser against reverse voltage transients. A silicon diode (1N914) is conveniently employed. R-L network 20, comprising an RF choke 21 (20 µH), a variable resistor 22 (to provide some adjustability) and fixed resistor 23 (to limit the minimum resistance) complete the circuit to the collector of the transistor (BFR-90).

FIG. 3 depicts the laser output (curve 31) (measured with an avalanche photo-diode) and the ECL input signal (curve 30) and demonstrates the circuit performance of the circuit depicted in FIG. 2 at 200 Megabits/sec data rate.

The ordinate of curve 30 is in 0.5 volt/division; the abscissa in 2 nano seconds/division. The ordinate of curve 31 is in 0.02 volt/division; the abscissa, in 2 nano seconds/division. Curve 31 shows a pulse rise time of 1.6 n sec, limited by the speed of the measurement equipment, demonstrating the high speed performance of the modulating circuit 15.

The unique features of the circuit are the use of a level shifting network to permit grounded laser anode operation with standard IC's and a simple one transistor driver which provides a fast modulation current independent of laser parameters.

What is claimed is:

1. A high speed modulator circuit for driving an anode grounded semiconductor laser or light emitting diode, LED, from either Transistor-Transistor Logic, TTL, or Emitter Coupled Logic, ECL, signals, said circuit comprising:
an input terminal for receiving said TTL or ECL signals; p0 gating means for providing a first or second negative voltage control signal in response to said logic level input signals;
driver means providing voltage-to-current conversion of said first and second control signals, said driver means comprising a transistor and emitter coupled resistor Re, said transistor having its base electrode coupled to a voltage shifting network receiving said control signal, said transistor having its collector coupled to the cathode of the laser or LED to provide high speed modulation current substantially independent of laser or LED impedance characteristics.

2. The modulator of claim 1 wherein said driver is further characterized as comprising a switching transistor having a main current conduction collector to emitter path coupled between the cathode electrode of the diode and a source of negative voltage.

3. The modulator of claim 2 wherein said driver is further characterized as including a pre-bias R-L network operating to add a pre-bias current, $I_{bias}$, to the collector electrode of the driver transistor.

4. The modulator of claim 3 wherein said pre-bias network includes an optical feedback bias control circuit, responsive to a light signal generated by said laser or light emitting diode.

5. The modulator of claim 3 wherein said laser comprises an AlGaAs double heterostructure diode laser.

6. A high speed modulator circuit for driving an anode grounded semiconductor laser or light emitting diode, LED, from Transistor-Transistor Logic, TTL, signals, said circuit comprising:
an input terminal for receiving TTL level input signals;
a TTL to ECL translator means for converting TTL input signals to ECL level control signals comprising either a first or second negative voltage logic level control signal;
gating means for providing a first or second negative voltage control signal in response to said logic level input signals;
driver means providing voltage-to-current conversion of said first and second control signals said driver means comprising a transistor and emitter coupled resistor Re, said transistor having its base electrode coupled to a voltage shifting network receiving said control signal, said transistor having its collector coupled to the cathode of the laser or LED to provide high speed modulation current substantially independent of laser or LED impedance characteristics.

* * * * *

UNITED STATES PATENT AND TRADEMARK OFFICE
CERTIFICATE OF CORRECTION

PATENT NO. : 4,339,822
DATED : July 13, 1982
INVENTOR(S) : James S. Kolodzey

It is certified that error appears in the above-identified patent and that said Letters Patent are hereby corrected as shown below:

IN CLAIM 1 LINE 7, before "gating" please delete ---p0---.

Signed and Sealed this

Twenty-sixth Day of October 1982

[SEAL]

Attest:

Attesting Officer

GERALD J. MOSSINGHOFF

Commissioner of Patents and Trademarks